(12) United States Patent
Liang (10) Patent No.: US 11,669,015 B2
(45) Date of Patent: Jun. 6, 2023

(54) PHOTOLITHOGRAPHY DEVICE AND METHOD FOR MONITORING POSITION OF A LIGHT SOURCE IN A PHOTOLITHOGRAPHY DEVICE

(71) Applicant: CHANGXIN MEMORY TECHNOLOGIES, INC., Hefei (CN)

(72) Inventor: Xueyu Liang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 107 days.

(21) Appl. No.: 17/593,054

(22) PCT Filed: Apr. 16, 2021

(86) PCT No.: PCT/CN2021/087799
§ 371 (c)(1),
(2) Date: Sep. 7, 2021

(87) PCT Pub. No.: WO2021/233033
PCT Pub. Date: Nov. 25, 2021

(65) Prior Publication Data
US 2022/0308458 A1    Sep. 29, 2022

(30) Foreign Application Priority Data
May 18, 2020 (CN) .......................... 202010420407.5

(51) Int. Cl.
*G03F 7/20* (2006.01)
*H01L 21/683* (2006.01)

(52) U.S. Cl.
CPC ...... *G03F 7/70141* (2013.01); *G03F 7/70191* (2013.01); *G03F 7/70733* (2013.01); *H01L 21/6831* (2013.01)

(58) Field of Classification Search
CPC ............ G03F 7/70141; G03F 7/70191; G03F 7/70733; G03F 7/70975; G03F 7/20; G03F 7/7085
See application file for complete search history.

(56) References Cited

U.S. PATENT DOCUMENTS

| 4,841,315 A | 6/1989 | Kokabu et al. |
| 7,378,666 B2 | 5/2008 | Domke et al. |

(Continued)

FOREIGN PATENT DOCUMENTS

| CN | 205590145 U | 9/2016 |
| CN | 205787592 U | 12/2016 |

(Continued)

OTHER PUBLICATIONS

China first office action in Application No. 202010420407.5, dated Apr. 8, 2022.

(Continued)

*Primary Examiner* — Hung V Nguyen
*Assistant Examiner* — Hung Henry Nguyen
(74) *Attorney, Agent, or Firm* — Syncoda LLC; Feng Ma (57) ABSTRACT

A photolithography device includes: a fixed slot, configured to install and fix the light source; a sensing module, configured to sense the distance information between the light source and the fixed slot; a prompt module, configured to send prompt information according to the distance information; and a determination module, configured to determine the installation status of the light source according to the prompt information.

18 Claims, 8 Drawing Sheets

(56) References Cited

U.S. PATENT DOCUMENTS

| | | | |
|---|---|---|---|
| 7,495,579 B2 * | 2/2009 | Sirota | ............... G08G 1/097 |
| | | | 246/473 R |
| 9,243,902 B2 | 1/2016 | Atac et al. | |
| 2002/0024649 A1 | 2/2002 | Sato | |

FOREIGN PATENT DOCUMENTS

| | | | |
|---|---|---|---|
| CN | 206002084 U | 3/2017 | |
| CN | 108983414 A | 12/2018 | |
| CN | 109973955 A | 7/2019 | |
| CN | 110307798 A | 10/2019 | |
| CN | 110940270 A | 3/2020 | |
| JP | 2003045219 A | 2/2003 | |
| JP | 2010015028 A | 1/2010 | |

OTHER PUBLICATIONS

International Search Report (ISR) in PCT/CN2021/087799 dated Jul. 28, 2021.

* cited by examiner

PHOTOLITHOGRAPHY DEVICE AND METHOD FOR MONITORING POSITION OF A LIGHT SOURCE IN A PHOTOLITHOGRAPHY DEVICE

CROSS-REFERENCE TO RELATED APPLICATIONS

This application is a national stage of International Application No. PCT/CN2021/087799 filed on Apr. 16, 2021, which claims priority to Chinese Patent Application No. 202010420407.5 filed on May 18, 2020. The disclosures of these applications are hereby incorporated by reference in their entirety.

TECHNICAL FIELD

The present application relates to the technical field of photolithography devices, and in particular to a photolithography device and a method for monitoring the position of a light source in a photolithography device.

BACKGROUND

Photolithography, as a main process in the production of integrated circuits, is a pattern transfer technique in which the pattern on the mask is transferred to the substrate coated with photoresist and a specific part of the film on the surface of the substrate is removed with a series of processes. Generally, photolithography may comprise forming a hole on a cover (also referred to as "mask") on the surface of a semiconductor wafer (also referred to as "substrate") to facilitate localized diffusion of impurities. The general photolithography process has steps of substrate surface cleaning, drying, primer coating, spin coating of photoresist, soft baking, alignment, exposure, post-baking, developing, hard baking, etching, and inspection; wherein the exposure process requires an exposure machine (or called "exposure system"). The exposure machine mainly comprises an exposure light source, an illumination system, and a projection objective lens. The illumination system and the projection objective lens sequentially modulate light emitted by the exposure light source to uniformly illuminate the mask and improve the imaging resolution to ensure better exposure effect.

At present, when the exposure light source is a mercury lamp, it is mainly manually installed. Whether or not it is installed in place is generally determined by the device engineers based on experience and feel. However, for safety reasons, the device engineers usually wear protective clothing and gloves, leading to poor perception of the position of the exposure light source. It is difficult for the device engineers to detect whether the exposure light source is installed in place. As a result, if the exposure light source is not installed in place, the device engineers may wrongly determine that it is installed in place, and may find, during the final inspection, that the exposure light source is not installed in place only after installing other related devices. In this case, it is necessary to reassembly the related devices and the exposure light source, leading to waste of time. On the other hand, if the exposure light source has been installed in place, the device engineers may determine that it is not installed in place and continuously apply a force to the exposure light source. The exposure light source may contain gases that are harmful to humans. In this case, the exposure light source may burst, leading to safety accidents.

SUMMARY

In view of this, embodiments of the present application provide a photolithography device and a method for monitoring the position of a light source in a photolithography device, so as to detect the installation status of the light source in real time and accurately and improve the operating safety of device engineers and the installation convenience.

In a first aspect, an embodiment of the present application provides a photolithography device, comprising: a fixed slot, configured to install and fix the light source; a sensing module, configured to sense a distance information between the light source and the fixed slot; a prompt module, configured to send prompt information according to the distance information; and a determination module, configured to determine an installation status of the light source according to the prompt information.

In a second aspect, an embodiment of the present application further provides a method for monitoring a light source in a photolithography device, implemented with any photolithography device described in the first aspect. The method for monitoring a position of a light source comprises: sensing, with a sensing module, a distance information between the light source and the fixed slot; sending, with a prompt module, prompt information according to the distance information; and determining, with a determination module, an installation status of the light source according to the prompt information.

With regard to the photolithography device and the method for monitoring a light source in a photolithography device according to the embodiments of the present application, a fixed slot, a sensing module, a prompt module, and a determination module are provided; wherein, the fixed slot is configured to install and fix the light source; the sensing module is configured to sense the distance information between the light source and the fixed slot; the prompt module is configured to send prompt information according to the distance information; and the determination module is configured to determine the installation status of the light source according to the prompt information. Thus, the distance information between the light source and the fixed slot can be monitored in real time with the collaboration of the sensor module, the prompt module and the determination module. On this basis, the prompt information can be sent and the status of the light source can be determined in real time to assist the installation of the light source. The installation status of the light source can be monitored in real time and accurately. The operating safety of device engineers can be improved and the installation convenience of light source can be improved.

BRIEF DESCRIPTION OF THE DRAWINGS

In order to more clearly describe the technical solutions of the exemplary embodiments of the present application, the drawings to be used in the description of the embodiments will be briefly introduced below. Apparently, the drawings introduced here are just drawings of some of the embodiments of the present application to be described below, not all of the drawings. For a person of ordinary skill in the art, other drawings may be obtained according to these drawings without paying any creative effort.

DETAILED DESCRIPTION

In order to make the purposes, technical solutions, and advantages of the present application more clear, the technical solutions of the present application will be fully described below through specific implementations with reference to the drawings in the embodiments of the present application. Apparently, the described embodiments are some of the embodiments of the present application, not all of the embodiments. Based on the embodiments of the present application, all other embodiments obtained with a person of ordinary skill in the art without paying any creative effort shall fall into the protection scope of the present application.

The photolithography device in the embodiments of the present application may be additionally equipped with a sensing module, a prompt module, and a determination module on the basis of the structure of the traditional photolithography device. The installation status of the light source in the photolithography device is monitored with the collaboration of these modules, to provide a reference for device engineers to install the light source and to operate and maintain the photolithography device. As the improvements of the photolithography device and the method for monitoring a light source in a photolithography device according to the embodiments of the present application, a fixed slot, a sensing module, a prompt module, and a determination module are provided; the fixed slot is configured to install and fix the light source, and is used as a reference position; the prompt module can send prompt information according to the distance information between the light source and the fixed slot sensed with the sensing module; and the determination module can determine the installation status of the light source according to the prompt information. Therefore, the installation status of the light source can be monitored in real time and more accurately, the operating safety of the device engineer can be improved, and the installation convenience of the light source can be improved.

The photolithography device and the method for monitoring the position of a light source in a photolithography device in the embodiments of the present application will be exemplarily described below with reference to FIGS. 1 to 14.

Figure 1:
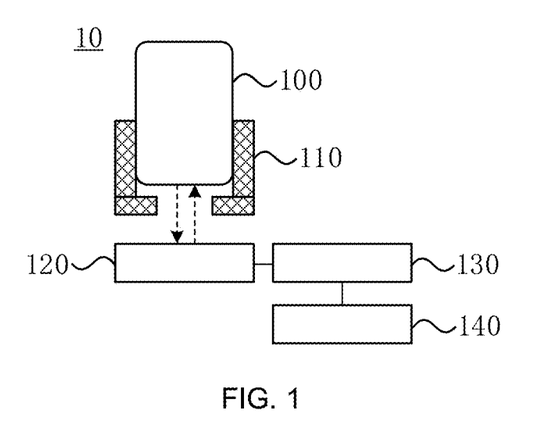
FIG. 1 is a schematic structure diagram of a photolithography device in an embodiment of the present application.

FIG. 1 is a schematic structure diagram of a photolithography device in an embodiment of the present application. With reference to FIG. 1, a photolithography device 10 in an embodiment of the present application comprises: a fixed slot 110, configured to install and fix a light source 100; a sensing module 120, configured to sense the distance information between the light source 100 and the fixed slot 110; a prompt module 130, configured to send prompt information according to the distance information; and a determination module 140, configured to determine the installation status of the light source according to the prompt information.

The light source 100 may be a light source used for exposure in a photolithography device (also may be referred to as "exposure light source"). Depending upon different exposure requirements, the light source may be a mercury lamp light source or other types of light sources known to those skilled in the art that need to be manually installed. It is not described repeatedly or limited in the embodiments of the present application.

The fixed slot 110 may be called base, which may be used to install and fix the light source 100 and provide a reference position for installing the light source 100. Exemplarily, the light source 100 may be installed and fixed in a manner that the light source 100 is recessed into the fixed slot 110 and the outer surface of the light source 100 is attached and fixed to the inner surface of the fixed slot 110.

The sensing module 120 may sense the position information of the light source 100, which may be regarded as sensing the distance information of the light source 100 relative to the fixed slot 110, that is, the relative position information of the light source 100 and the fixed slot 110. Alternatively, the position information of the light source 100 sensed with the sensing module 120 may be regarded as the coordinate position information of the light source 100 in the reference coordinate system. Meanwhile, the fixed slot 110 also exists in the reference coordinate system. Based on this, the sensing module 120 may determine the distance information between the light source 100 and the fixed slot 110 according to the coordinate position information of the light source 100 and the coordinate information of the fixed slot 110.

Exemplarily, the sensing module 120 may realize the detection of the light source 100 based on photoelectricity, acousto-electricity, piezoelectricity, etc., and its optional structure will be described in detail below.

The prompt module 130 may compare the distance information between the light source 100 and the fixed slot 110 with the reference distance between the two when the light source is installed in place (that is, the "threshold range" hereinafter), and send prompt information indicative of the relative magnitude of the two as well as sound-light prompt information related to the installation status. This will be described in detail below.

The determination module 140 may determine the installation status of the light source 100 according to the prompt information sent with the prompt module 130.

Exemplarily, the installation status of the light source 100 may comprise the distance between the light source 100 and the fixed slot 110 (the opposing surfaces of the two are used as the reference surfaces for determining the distance between the two, exemplarily, by taking the orientation shown in FIG. 1 as an example, the opposing surfaces may include the bottom surface of the light source 100 and the plane of the fixed slot 110 facing the bottom surface), and information about whether the light source 100 is installed in place.

Thus, the prompt information may comprise the distance information and the information about whether the light source is installed in place.

Based on this, the device engineers may adjust the force applied to the light source 100 according to the prompt information sent by the prompt module 130 and the installation status of the light source determined with the determination module 140. For example, when the two are far apart, the device engineers may apply a greater force to the light source 100; and when the two are closer, the device engineers may apply a smaller force to the light source 100. And, the device engineers may determine whether to stop applying a force to the light source 100 according to the information about whether the light source 100 is installed in place as prompted or determined with the prompt module 130 and the determination module 140. For example, when the determination module 140 determines that the light source 100 is installed in place, the prompt module 130 prompts the device engineers that the light source 100 is installed in place. In this case, the device engineers stop applying a force to the light source 100. This can prevent the light source 100 from bursting, which is helpful to avoid safety accidents caused by bursting. Thus, the operating safety of device engineers can be improved.

Meanwhile, the modules in the photolithography device 10 may be used to monitor the installation process of the light source 100 in real time, and to guide the installation actions. Thus, the convenience for the device engineers to install the light source can be improved.

It may be understood that the installation of the light source 100 in place may mean that the distance between the light source 100 and the fixed slot 110 meets the preset requirement (i.e., the "threshold range" hereinafter). For example, the distance between the two is 0.

It should be noted that, in the embodiment of the present application, the up and down assembly and disassembly of the light source 100 relative to the fixed slot 110 is taken only as an example for exemplification. In other implementations, the disassembly and assembly directions of the light source 100 relative to the fixed slot 110 may be other directions in the spatial coordinates, which may be set according to the requirements of the photolithography device. It is not limited in the embodiment of the present application.

The optional structural forms of the sensing module 120 and the prompt module 130 will be exemplified below with reference to FIGS. 2-8.

Figure 2:
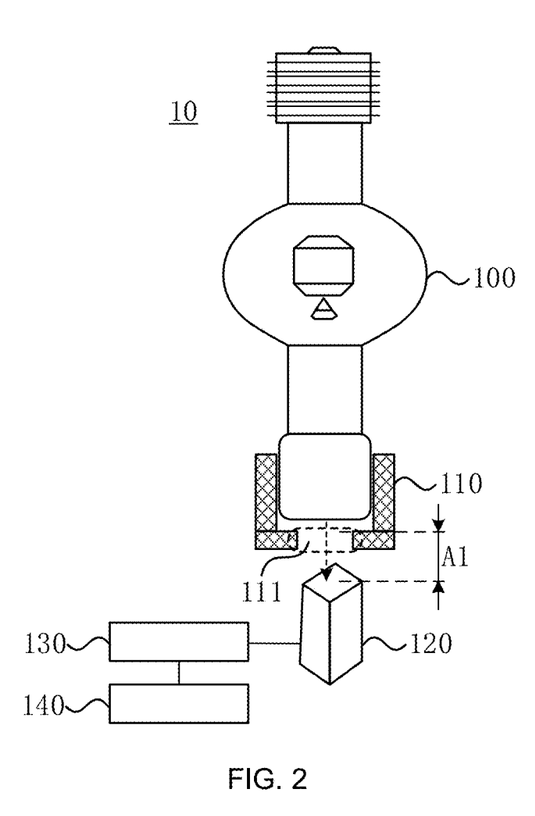
FIG. 2 is a schematic structure diagram of another photolithography device in an embodiment of the present application.
Figure 3:
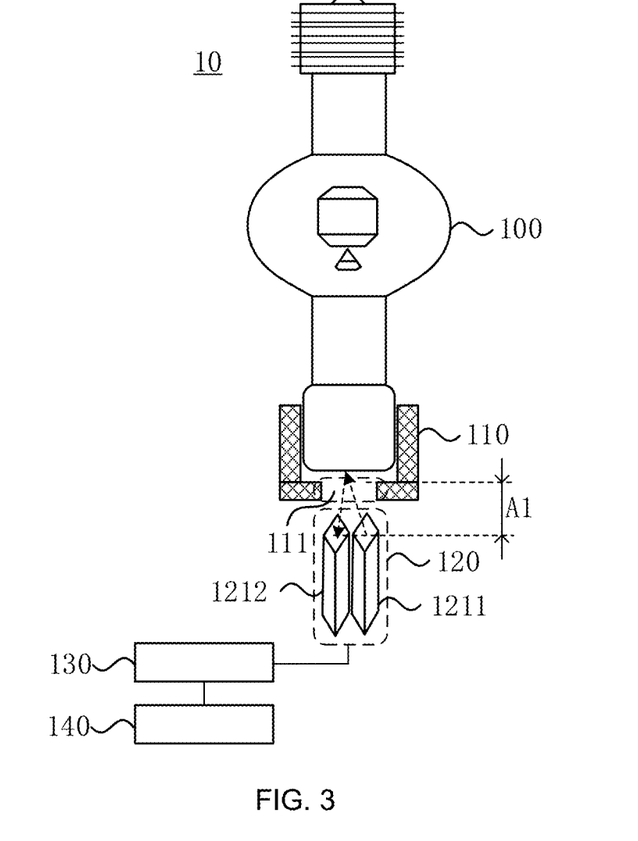
FIG. 3 is a schematic structure diagram of still another photolithography device in an embodiment of the present application.

In an embodiment, FIG. 2 is a schematic structure diagram of another photolithography device in an embodiment of the present application, and FIG. 3 is a schematic structure diagram of still another photolithography device in an embodiment of the present application. With reference to FIG. 2 or 3, a through hole 111 is formed on one side of the fixed slot 110, from which the light source 100 is exposed; and the sensing module 120 is arranged opposite to the through hole 111, and the sensing module 120 senses the distance information between the light source 100 and the fixed slot 110 through the through hole 111.

Exemplarily, the sensing module 120 may comprise a photoelectric sensor, and the through hole 111 is formed on the bottom of the fixed slot 110 relative to the light source 100; the photoelectric sensor receives light emitted or reflected by the light source 100 via the through hole 111, and further determines the distance information according to the position information of the light source 100.

The photoelectric sensor senses the position information of the light source 100 based on photoelectric conversion. The photoelectric sensor has the advantages of high sensitivity, fast response, non-contact detection and long service life, and the distance measurement accuracy is high, usually within ±0.01 mm. Thus, the position of the light source 100 can be detected in real time and accurately.

Exemplarily, the photoelectric sensor may be a receiving photoelectric sensor (as shown in FIG. 2) or a reflecting photoelectric sensor (as shown in FIG. 3), both of which can realize real-time monitoring of the position of the light source 100. The main difference is that, the former can use the light source attached to the light source 100 as the detection light source, which is helpful to simplify the structure of the photoelectric sensor, and the latter uses the light source built-in the photoelectric sensor as the detection light source, which is helpful to simplify the structure of the light source 100.

With the formation of the through hole 111 on the fixed slot 110, light from the detection light source is allowed to be linearly transmitted between the light source 100 and the photoelectric sensor by the through hole 111. In this way, while realizing photoelectric detection, the light transmission path may be simplified. It is helpful to ensure a high signal-to-noise ratio to ensure high detection accuracy; and, it is helpful to simplify the overall structure of the photolithography device 10.

The reflecting photoelectric sensor will be exemplarily described below with reference to FIG. 3.

In an embodiment, with reference to FIG. 3, the photoelectric sensor comprises a detection light source 1211 (also called transmitting terminal) and a photosensitive element 1212 (also called receiving terminal or light receiving device); the detection light source 1211 emits light to the light source 100 side; the photosensitive element 1212 receives the light reflected by the light source 100 side.

In this way, the detection light source 1211 built-in the photoelectric sensor may be used to realize the reflecting photoelectric detection.

Exemplarily, the detection light source 1211 may be an LED lamp with high intensity, so that a high signal-to-noise ratio may be ensured and the detection accuracy is high.

In other implementations, the detection light source 1211 may be other types of light sources known to those skilled in the art, which may be set according to the requirements of the photolithography device 10. It is not limited in the embodiment of the present application.

Exemplarily, taking the orientation shown in FIG. 3 as an example, the photoelectric sensor may be disposed on a side of the bottom of the fixed slot 110 away from the light source 100, with a distance of A1 from the plane of the through hole 111. The photoelectric sensor comprises a transmitting terminal and a receiving terminal. The operating frequency of the transmitting terminal may be 20 Hz, that is, the transmitting terminal emits light to the light source 100 (which may be a mercury lamp) every 0.05 seconds; and the receiving terminal is responsible for receiving light reflected from the bottom of the light source 100. The distance between the bottom of the light source 100 and the bottom of the fixed slot 110 may be obtained with the following formula:

$$\text{Distance} = (vT/2 - A1)\,mm;$$

where v is the speed of light, and T is the time from emission to reception of light.

The calculation process may be executed with the prompt module 130.

On this basis, in order to improve the measurement accuracy, the distance between the photoelectric sensor and the through hole 111 is set.

In an embodiment, further referring to FIGS. 2 and 3, the photoelectric sensor is fixed on a side of the light source 100 away from the plane of the through hole 111, and the distance A1 between the photoelectric sensor (which may be regarded as a plane that receives light) and the plane of the through hole 111 is 1.5 mm≤A1≤3 mm.

With this arrangement, on one hand, the distance between the two will not be too small, so as to ensure that the photoelectric sensor 121 has sufficient response time; and on the other hand, the distance between the two will not be too large, so that the loss of light energy is low, which helps to ensure a high signal-to-noise ratio and high detection accuracy.

In other implementations, 2.5 mm≤A1≤3 mm, or 1.5 mm≤A1≤2.5 mm, or A1=2 mm, or other optional numerical values or numerical ranges known to those skilled in the art may be set according to the requirements of the photolithography device 10. It is not limited in the embodiment of the present application.

In an embodiment, the prompt module 130 has a built-in threshold range of the distance between the light source 100 and the fixed slot 110, and the prompt module 130 compares the distance information with the threshold range in real time and sends prompt information according to the comparison result.

The threshold range is the reference position range of the light source 100. Exemplarily, when the distance between the light source 100 and the fixed slot 110 is within the threshold range, it is indicated that the light source 100 is installed in place.

Figure 4:
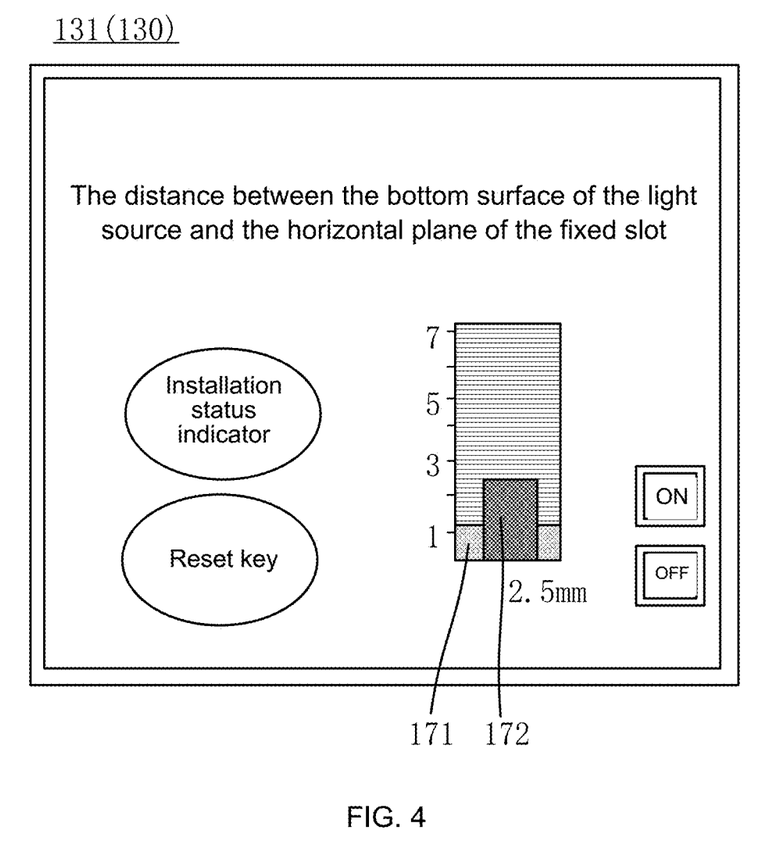
FIG. 4 is a schematic view of a display interface of a prompt module in an embodiment of the present application.
Figure 5:
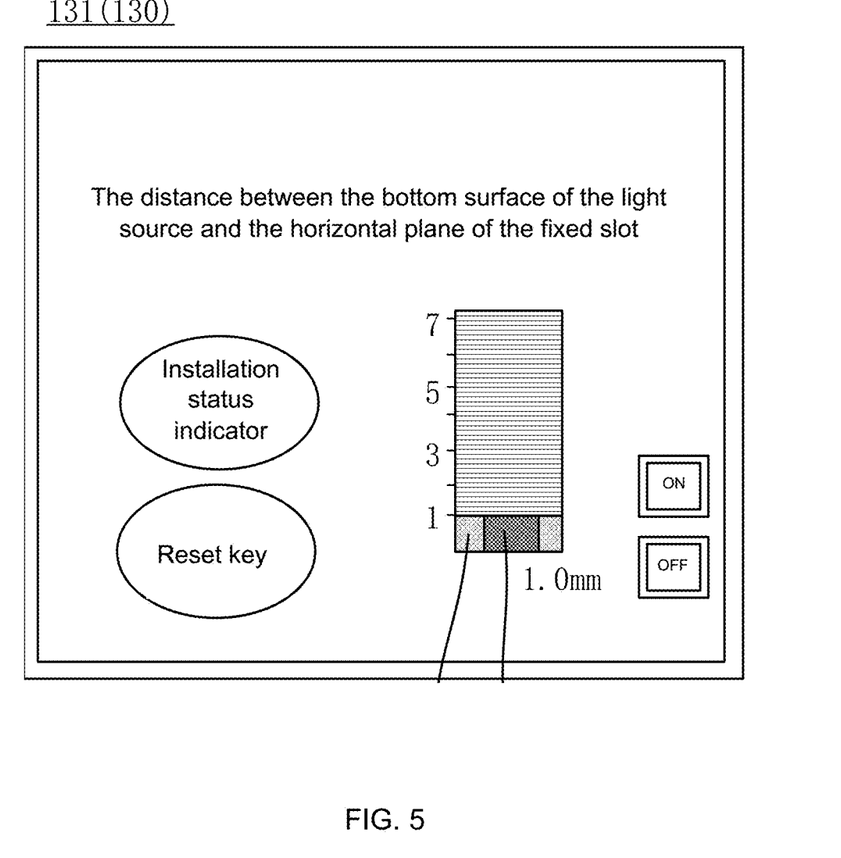
FIG. 5 is a schematic view of a display interface of another prompt module in an embodiment of the present application.

In an embodiment, FIG. 4 is a schematic view of a display interface of a prompt module in an embodiment of the present application, and FIG. 5 is a schematic view of a display interface of another prompt module in an embodiment of the present application. With reference to FIGS. 4 and 5, the prompt module 130 comprises a light source position display 131. The light source position display 131 is configured to graphically display the threshold range and distance information. The light source position display 131 comprises a first display area 171 (area with sparse dots) and a second display area 172 (area with dense dots). The threshold range is displayed in the first display area 171, and the distance information is displayed in the second display area 172. The first display area 171 overlaps with the second display area 172, and the visual statuses of the first display area 171 and the second display area 172 may be the same or different. Exemplarily, the relative positional relationship between the light source 100 and the fixed slot 110 may be indicated with a progress bar displaying "the distance between the bottom surface of the light source and the horizontal plane of the fixed slot". The bottom surface of the light source may be regarded as the surface of the light source 100 facing the through hole 111 of the fixed slot 110. The horizontal plane of the fixed slot may be regarded as the surface of the fixed slot 110 facing the bottom surface of the light source 100. When the distance between the two is within the threshold range, it is indicated that the two surfaces are attached in place.

Exemplarily, one side of the first display area 171 overlaps with one side of the second display area 172, to visually display the relative magnitude relationship between the threshold range and the distance information.

Exemplarily, when the exposure light source of the photolithography device 10 is a mercury lamp, the light source position display 131 can display the distance between the bottom surface of the mercury lamp and the horizontal plane of the base in real time. If the distance between the two surfaces is 1 mm, it is indicated that the light source 100 is installed in place. With reference to FIGS. 2 and 3, the photoelectric sensor may detect the distance between the lower surface of the mercury lamp and the horizontal plane of the base in real time. When the detected distance is greater than 1 mm (for example, 2.5 mm, as shown in FIG. 4), the installation status indicator is yellow, indicating that the light source is not installed in place, and the device engineers still need to apply a force to the light source; and when the light detection distance is equal to or less than 1 mm (for example, 1.0 mm, shown in FIG. 5), the installation status indicator changes to green, indicating that the light source is installed in place and the device engineers do not need to apply a force. In this way, by detecting the distance between the bottom surface of the mercury lamp and the horizontal plane of the base with the photoelectric sensor in real time and displaying with the light source position display 131, a reference is provided for the installation personnel (i.e., device engineers, also called operators) and this avoids the continuous application of a force to the light source after it is installed in place and the stopped application of a force to the light source before it is installed in place. Thus, the installation convenience of the light source and the operating safety can be improved.

Figure 6:
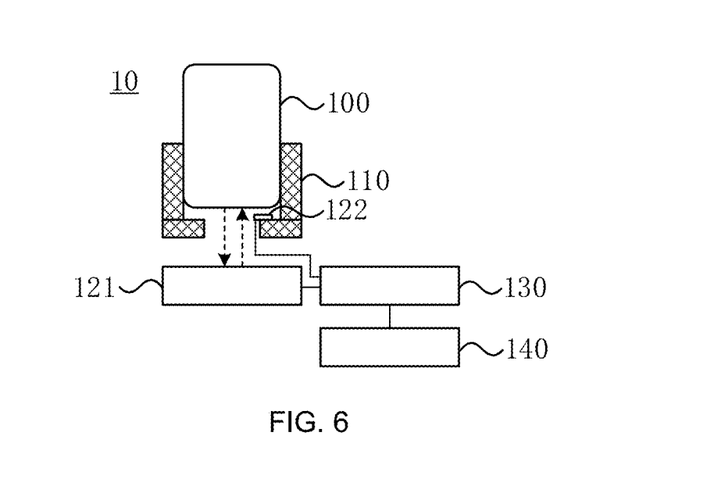
FIG. 6 is a schematic structure diagram of yet another photolithography device in an embodiment of the present application.

In an embodiment, FIG. 6 is a schematic structure diagram of yet another photolithography device in an embodiment of the present application. With reference to FIG. 6, the photolithography device may further comprise a critical sensing module 122, disposed in the fixed slot 110, located at a critical position where the light source 100 is installed, and is configured to detect whether the light source 100 is installed in place.

When the light source 100 is installed in place, the critical sensing module 122 may come into contact with the light source 100 to sense, in a contact manner, that the light source 100 is installed in place. Thus, the accuracy in monitoring the position of the light source 100 is further improved.

Exemplarily, the critical sensing module 122 may comprise a pressure sensor.

The pressure sensor is a contact sensor which may be set corresponding to the position where the light source 100 is installed in place. When the light source 100 comes into contact with the pressure sensor, the light source 100 is installed in place. In this case, the pressure sensor transmits, to the prompt module 130, a corresponding signal which indicates that the light source is installed in place; and the prompt module 130 prompts, according to the information about the installation of the light source 100 in place detected with the pressure sensor, the installation personnel that there is no need to further apply a force because the light source has been installed in place. Thus, the light source 100 may be prevented from bursting due to the continued application of a force. It is helpful to ensure the operating safety.

Figure 7:
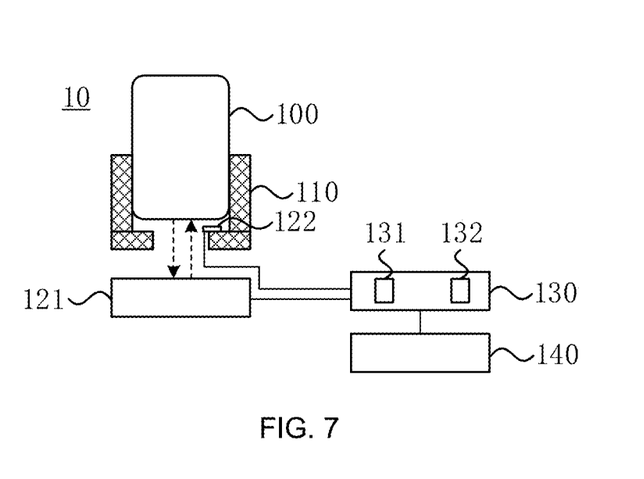
FIG. 7 is a schematic structure diagram of yet another photolithography device in an embodiment of the present application.

In an embodiment, FIG. 7 is a schematic structure diagram of yet another photolithography device in an embodiment of the present application. With reference to FIG. 7, the prompt module 130 further comprises a sound-light alarm 132 configured to give a sound-light warning when the critical sensing module 122 detects that the light source 100 is installed in place.

The sound-light alarm 132 may give a prompt when the light source 100 is installed in place, by making a sound (which may be a distinct warning tone, for example buzzing) and emitting light (which may be conspicuous light, for example red light).

In this way, with obvious prompt effect, it is convenient for the installation personnel to immediately stop applying a force to the light source 100, thereby ensuring the safety of the light source and the safety of the operators.

In other implementations, the sound-light alarm 132 may be other structural forms known to those skilled in the art. For example, it may emit light of other colors, or give sound of other types, which may be set according to the requirements of the photolithography device 10. It is not limited in the embodiment of the present application.

Figure 8:
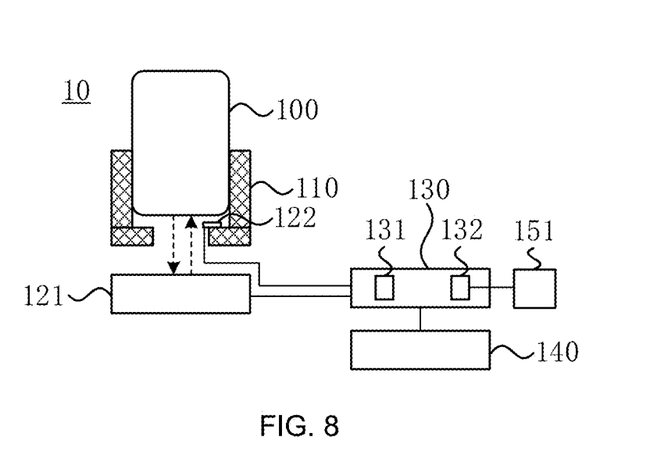
FIG. 8 is a schematic structure diagram of yet another photolithography device in an embodiment of the present application.

In an embodiment, FIG. 8 is a schematic structure diagram of yet another photolithography device in an embodiment of the present application. With reference to FIG. 8, the photolithography device 10 further comprises a reset key 151 configured to eliminate the sound-light warning after the sound-light alarm 132 gives a sound-light warning.

In this way, the sound-light alarm 132 may be "initialized" to prepare for the next sound-light warning.

Exemplarily, the reset key 151 may be a switch key in a mechanical structure, or a graphic key that may be displayed on the light source position display 131. The graphic key may be triggered by clicking with a mouse, or trigged by touching with a finger, a stylus, or the like, or triggered in other ways known to those skilled in the art. It is not limited in the embodiment of the present application.

Exemplarily, referring to FIG. 4 or FIG. 5, the "reset key" may be displayed on the light source position display 131. When the prompt module 130 determines that the light source 100 has been installed in place, the sound-light alarm 132 is triggered to remind the installation personnel that the light source has been installed in place. Thereafter, the installation personnel may press down the reset key displayed on the light source position display 131 to cancel the warning.

Thus, the reset key 151 may be integrated with the light source position display 131, so that the photolithography device 10 has a high degree of integration and a simple overall structure.

Figure 9:
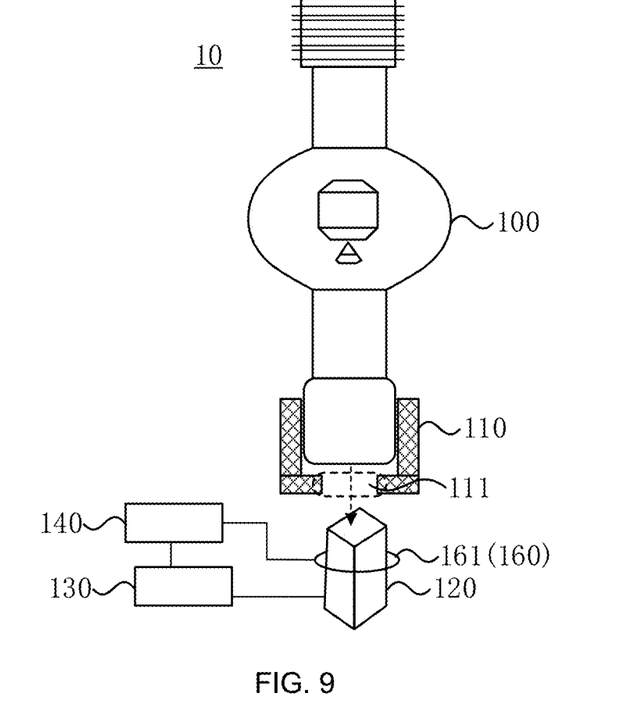
FIG. 9 is a schematic structure diagram of yet another photolithography device in an embodiment of the present application.

In an embodiment, FIG. 9 is a schematic structure diagram of yet another photolithography device in an embodiment of the present application. With reference to FIG. 9, the photolithography device 10 further comprises a position correction module 160 that is communicatively connected to the determination module 140; and the position correction module 160 is configured to correct the position of the light source 100 when the determination module 140 determines that the installation status of the light source 100 is abnormal.

The position correction module 160 may be used in the fine installation adjustment of the light source 100 or in the maintenance process after it is installed. In this case, the light source 100 and its protective structure are all installed. When the position of the light source 100 is deviated, the related structures are usually disassembled in the related art, and the device engineers manually adjust the position of the light source 100. It is time-consuming and laborious. In the embodiment of the present application, by setting the position correction module 160, when the position of the light source 100 is deviated, the position correction module 160 may be used to automatically adjust the position of the light source 100 through the closed-loop self-feedback of the photolithography device 10. It saves both time and labor.

Figure 10:
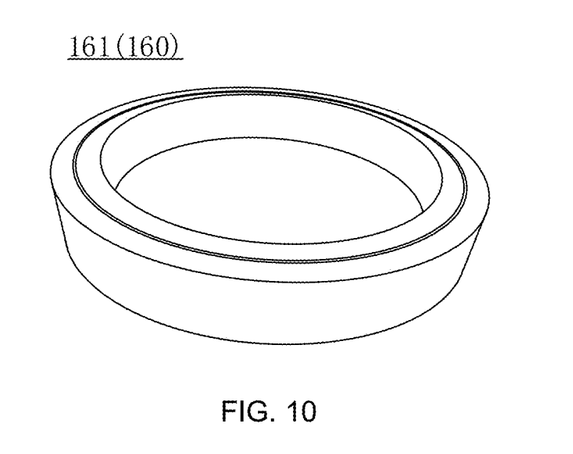
FIG. 10 is a schematic structure diagram of an annular electromagnetic chuck in an embodiment of the present application.

In an embodiment, FIG. 10 is a schematic structure diagram of an annular electromagnetic chuck in an embodiment of the present application. With reference to FIGS. 9 and 10, the position correction module 160 comprises an annular electromagnetic chuck 161. The annular electromagnetic chuck 161 creates, when energized, an attractive force or a repulsive force to the light source 100 so as to correct the relative positional relationship between the light source 100 and the fixed slot 110.

The annular electromagnetic chuck 161 represents an electromagnetic principle in which the internal coils are energized to produce magnetism to attract, through a magnetic conductive panel, the workpiece (i.e., the light source 100) coming into contact with the surface of the panel; or, the internal coils are de-energized to eliminate magnetism, and in this case, the attractive force disappears and the light source 100 is released. The annular electromagnetic chuck 161 has a high holding force, up to 16 kg/cm$^2$, and the resulting attractive force (physically, magnetism) can meet the requirements for correction of the vertical displacement of the light source.

Exemplarily, in order to ensure that the light source 100 receives a uniform force, the annular electromagnetic chuck 161 is installed around the photoelectric detector 121 and is installed at the bottommost part of the middle area of the fixed slot 110.

In other implementations, other types of annular electromagnetic chucks or position correction modules may be used to act on the light source in other ways known to those skilled in the art, which will not be repeated in the embodiment of the present application.

When the light source 100 is loose relative to the fixed slot 110, that is, when the distance between the two becomes large, the annular electromagnetic chuck 161 may be used to generate an attractive force to the light source 100 so that they go back to the position where the light source is installed in place. Or, when the light source 100 is recessed relative to the fixed slot 110, that is, when the distance between the two becomes small, the annular electromagnetic chuck 161 or other forms of position correction module 160 may be used to generate a repulsive force to the light source 100 so that they go back to the position where the light source is installed in place.

In this way, the maintenance process of the light source 100 may be simplified, which is helpful to reduce the maintenance cost.

Figure 11:
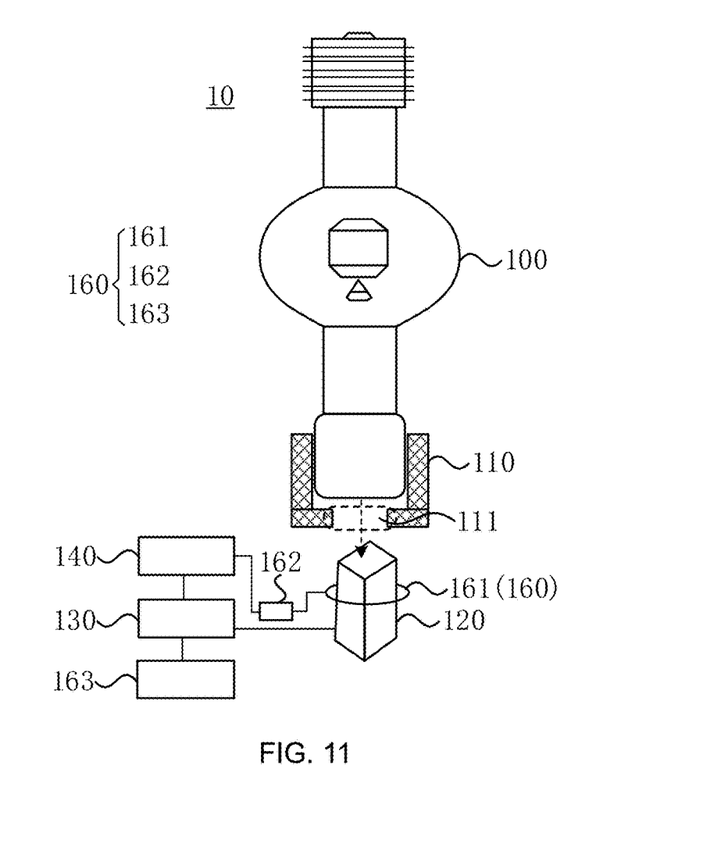
FIG. 11 is a schematic structure diagram of yet another photolithography device in an embodiment of the present application.

In an embodiment, FIG. 11 is a schematic structure diagram of yet another photolithography device in an embodiment of the present application. With reference to FIG. 11, the position correction module 160 further comprises a drive circuit 162 and a switch key 163. The drive circuit 162 is configured to control the annular electromagnetic chuck 161 to be in a power-on status or a power-off status under the control of the switch key 163.

Thus, the normal operation and manual control of the annular electromagnetic chuck 161 are realized, which is convenient for operation, maintenance and debugging.

Exemplarily, the switch key 163 may be a switch key in a mechanical structure, or a graphic key that may be displayed on the light source position display 131 (shown as "ON" and "OFF" in FIGS. 4 and 5). The graphic key may be triggered by clicking with a mouse, or trigged by touching with a finger, a stylus, or the like, or triggered in other ways known to those skilled in the art. It is not limited in the embodiment of the present application.

Exemplarily, with reference to FIG. 4 or FIG. 5, the "switch key" may be displayed on the light source position display 131. When the determination module 140 determines that there is a deviation in the position of the light source 100, the light source position display 131 may display the distance between the light source 100 and the fixed slot 110, and the device engineers may trigger the "ON" in the switch key to enable the annular electromagnetic chuck 161 to operate so as to correct the position of the light source 100. After the position of the light source 100 is corrected, the device engineers may trigger the "OFF" in the switch key and the annular electromagnetic chuck 161 stops operating.

Thus, the switch key 163 may be integrated with the light source position display 131, such that the photolithography device 10 has a high degree of integration and a simple overall structure.

In addition, during the maintenance of the photolithography device 10, by detecting the position of the light source 100 in real time, when the machine vibration and airflow of the photolithography device 10 affect the position of the light source, the position deviation of the light source may be detected in time. On this basis, when the optical performance of the machine is abnormal, the basis for troubleshooting related to the light source may be provided.

Figure 12:
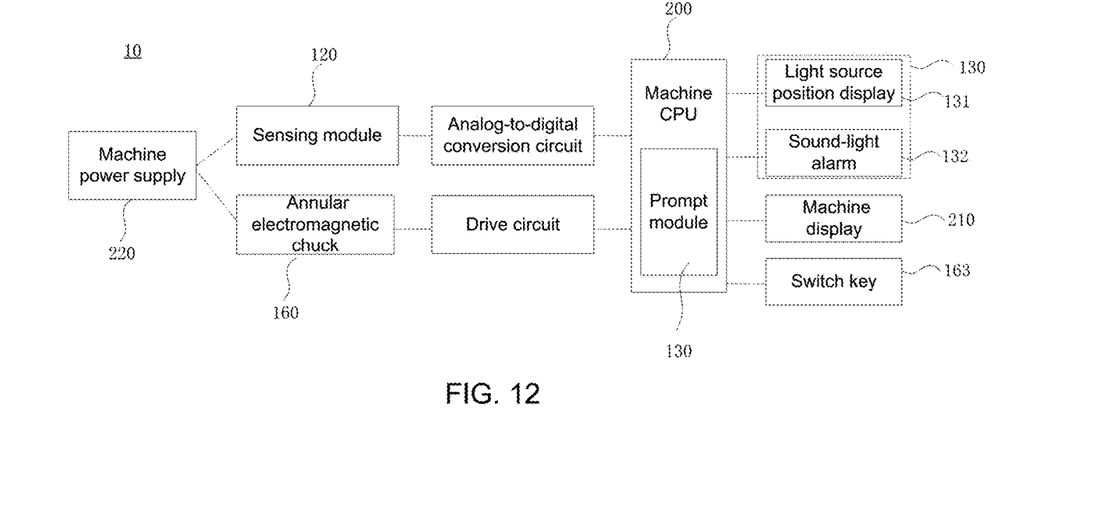
FIG. 12 is a schematic structure diagram of yet another photolithography device in an embodiment of the present application.

On the basis of the above implementations, FIG. 12 is a schematic structure diagram of yet another photolithography device in an embodiment of the present application. With reference to FIG. 12, the photolithography device 10 further comprises a machine display 210 which is communicatively connected to the prompt module 130; and the machine display 210 may be configured to display the operating status of the photolithography device 10.

The operating status of the photolithography device 10 may comprise the status of the light source monitored with the photolithography device 10. In this way, the display interface of the light source position display 131 shown in FIG. 4 or FIG. 5 may be integrated with the display interface of the machine display 210 of the photolithography device 10, thereby ensuring that there is a small number of structures used for displaying, which is helpful to simplify the overall mechanical structure of the photolithography device 10.

Figure 13:
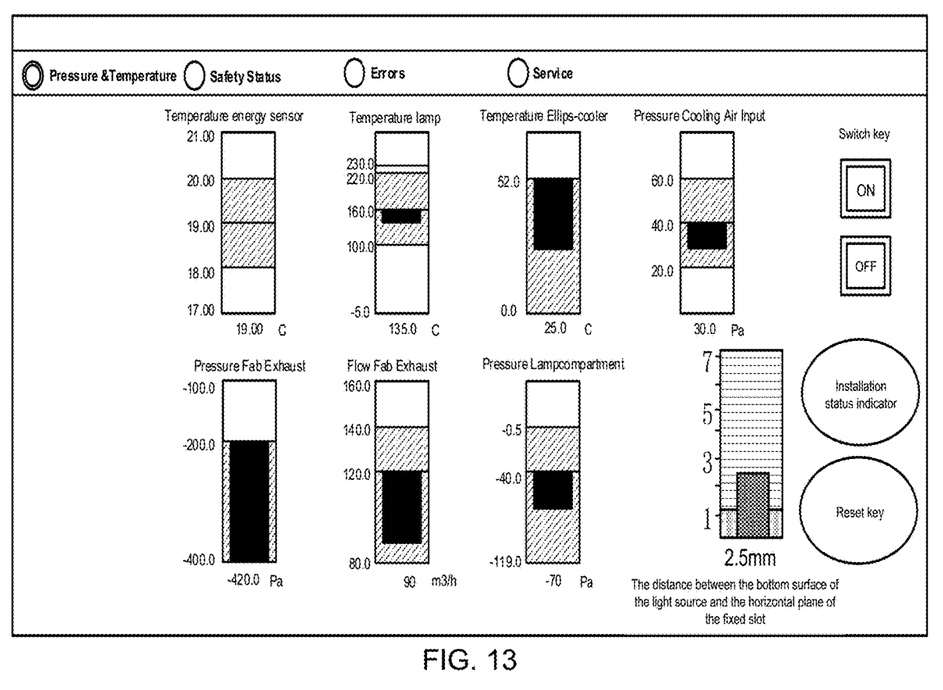
FIG. 13 is a schematic view of a display interface of a machine display in the photolithography device in an embodiment of the present application.

Exemplarily, FIG. 13 is a schematic view of a display interface of a machine display in the photolithography device in an embodiment of the present application. With reference to FIGS. 12 and 13, on the display interface, on the basis of the original display interface of the machine display 210, an indicator bar displaying "the distance between the bottom surface of the light source and the horizontal plane of the fixed slot" and an "installation status indicator" displaying the installation status of the light source 100 are additionally provided.

Exemplarily, still referring to FIG. 13, the display interface may also display the "reset key" together.

Exemplarily, still referring to FIG. 13, the display interface may also display the "switch key" together, including "ON" and "OFF".

It may be understood that, when a variety of pieces of to-be-displayed information in the photolithography device 10 are integrated to be displayed on the machine display 210, each to-be-displayed information may be displayed on the same display interface, or displayed on two or more different display interfaces, which may be set according to the requirements of the photolithography device 10. It is not limited in the embodiment of the present application.

In an embodiment, still referring to FIG. 12, the photolithography device 10 further comprises a machine power supply 220. The machine power supply 220 is configured to supply power to at least one of the sensing module 120, the prompt module 130, and the position correction module.

The power supply mode may comprise direct power supply or indirect power supply. Meanwhile, the sensing module 120, the prompt module 130, and the position correction module may be independently supplied with power, which is not limited in the embodiment of the present application.

In an embodiment, still referring to FIG. 12, the photolithography device 10 may further comprise a machine CPU200, and the prompt module 130 may be integrated with the machine CPU200. The operating principle of the machine CPU200 will be exemplarily described in conjunction with the sensing module 120 comprising a pressure sensor and a photoelectric sensor, by taking the exposure light source being a mercury lamp as an example.

Exemplarily, a pressure sensor is installed on the base of the mercury lamp. When the mercury lamp comes into contact with the pressure sensor, the pressure sensor will output corresponding analog signals under certain rules. The analog signals are converted, with an analog-to-digital conversion circuit electrically connected thereto, into digital signals that may be recognized with the machine CPU200. The machine CPU200 determines that the mercury lamp is installed in place after operating and processing the received digital signals, and then sends an instruction to drive the sound-light alarm circuit to operate so as to prompt the install personnel to stop applying a force to the mercury lamp. Then, the install personnel eliminate the sound-light warning by the reset key on the sound-light alarm circuit.

Meanwhile, a photoelectric sensor is installed on the base of the mercury lamp to detect the distance from the bottom of the mercury lamp to the base. The machine CPU200 receives the position information detected with the photoelectric sensor (same as above, also digital signals), and processes and then outputs it to the display near the mercury lamp (as shown in FIG. 4 or FIG. 5, the display interface of the light source position display) to display the current distance between the mercury lamp and the bottom, thereby providing a numerical reference for the install personnel.

In an embodiment, still referring to FIG. 12, the photolithography device 10 may further comprise an analog-to-digital conversion circuit 125, and the analog-to-digital conversion circuit 125 is electrically connected between the sensing module 120 and the machine CPU200.

Exemplarily, in the analog-to-digital conversion circuit, the output signal from the photoelectric sensor is amplified, stabilized, filtered with the signal conditioning circuit therein, and is then subjected to ND conversion to become a digital signal that may be recognized with the machine CPU200.

Exemplarily, the photolithography device may further comprise a keyboard circuit configured to control the keys in the keyboard so as to control the on or off of the switch keys. Exemplarily, when the switch key is turned off, the pin voltage corresponding to the machine CPU200 is 5V; and when the switch key is pressed down, the pin voltage corresponding to the machine CPU200 is 0V. Depending upon whether or not there is a key pressed down, and according to the software programming setting, a corresponding function is executed. In this keyboard circuit design, the switch key may be configured to reset the sound-light alarm to avoid long-time warning, and may be configured to control the current on and off of the electromagnetic chuck.

In an embodiment, still referring to FIG. 12, the machine display 210 may be a touch screen. The touch screen can realize input and output at the same time and can realize the input function without using a keyboard, a mouse, etc. It is helpful to provide the machine display with more functions, and is helpful to simplify the input-related structural components.

It should be noted that the FIGS. 1-13 only exemplarily show part of the structure of the photolithography device 10. In other implementations, the photolithography device may comprise other structural components known to those skilled in the art. It is not repeated or limited in the embodiment of the present application.

Figure 14:
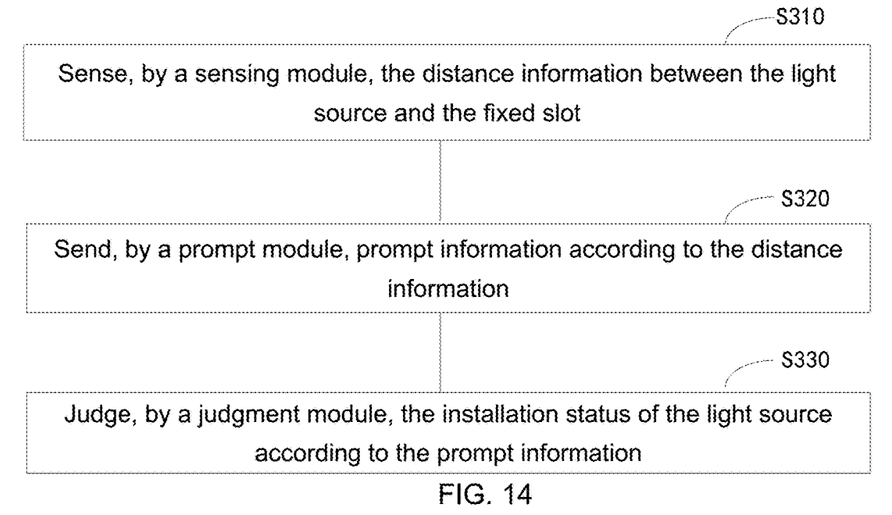
FIG. 14 is a schematic flowchart of a method for monitoring the position of a light source in a photolithography device in an embodiment of the present application.

Based on the same application concept, an embodiment of the present application further provides a method for monitoring the position of a light source in a photolithography device, which may be executed with any photolithography device described in the above implementations. Therefore, the method for monitoring the position of the light source also has the helpful effects of the photolithography device in the above implementations. The similarities may be understood with reference to the above explanation of the photolithography device, and will not be repeated hereafter. Exemplarily, FIG. 14 is a schematic flowchart of a method for monitoring the position of a light source of a photolithography device in an embodiment of the present application. With reference to FIG. 14, the method for monitoring the position of the light source may comprise:

S310: sensing, with a sensing module, the distance information between the light source and the fixed slot;

S320: sending, with a prompt module, prompt information according to the distance information; and S330: determining, with a determination module, the installation status of the light source according to the prompt information.

Thus, real-time and more accurate monitoring of the installation status of the light source may be achieved, which can provide guidance for the installation and maintenance of the light source. It is helpful to improve the operating safety of device engineers and the installation convenience of the light source; and, it is convenient to provide maintenance data support.

Exemplarily, on the basis of FIG. 14, after S330, the method may further comprise:

correcting, with a position correction module, the light source when the determination module determines that the light source is not installed in place.

In this way, the maintenance of the light source may be simplified.

Based on the above implementations, the process of monitoring the position of the light source in a photolithography device will be exemplified below, by taking, as an example, the case where the light source 100 is a mercury lamp, the sensing module 120 comprises a photoelectric sensor and a pressure sensor, the prompt module 130 comprises an sound-light alarm and a light source position display interface, the prompt module 130 and the machine CPU are integrated, and the position correction module 160 comprises a annular electromagnetic chuck, and when the light source is installed in place, the distance between the bottom surface of the mercury lamp and the horizontal plane of the base is equal to 1 mm. This process may comprise:

the photolithography device is turned on;

as the bottom surface of the mercury lamp gradually approaches the horizontal plane of the base, the sensor module monitors the position of the mercury lamp in real time;

the CPU of the machine determines whether the distance between the bottom of the mercury lamp and the horizontal plane of the base is greater than 1 mm;

If so, it is indicated that the mercury lamp has not been installed in place; the progress bar of the light source position display is in yellow, and the installation status indicator is in yellow; and, the sound-light alarm does not work;

As the bottom surface of the mercury lamp continues approaching the horizontal plane of the base, the determination step is repeated;

if not, it is indicated that the mercury lamp has been installed in place; the following steps are executed:

the progress bar of the light source position display is in green, and the installation status indicator is in green; and, when the pressure sensor comes into contact with the mercury lamp, the CPU of the machine triggers the sound-light alarm to give a warning;

the reset key is triggered to eliminate the warning;

so far, the installation of the mercury lamp ends.

Thereafter, the operation and maintenance process of the photolithography device specifically comprises:

the photolithography device continuously monitors the position of the mercury lamp;

the CPU of the machine determines whether the distance between the bottom of the mercury lamp and the horizontal plane of the base is greater than 1 mm;

If so, the determination module determines that there is a deviation in the position of the mercury lamp and triggers another alarm to work;

The device engineers confirm the position of the mercury lamp through the light source position display;

upon confirming the deviation of the mercury lamp, the switch key is triggered;

the annular electromagnetic chuck adjusts the position of the mercury lamp; and

When the CPU of the machine determines that the distance between the bottom of the mercury lamp and the horizontal plane of the base is equal to or less than 1 mm, the mercury lamp returns to its position and the adjustment ends.

The photolithography device according to the embodiments of the present application has at least the following beneficial effects.

1. Real-time and accurate monitoring of the installation process of the light source through the photolithography device is beneficial to improve the operating safety and the installation convenience.
2. Real-time monitoring of the position of the light source with the photolithography device can provide troubleshooting data related to the position of the light source when the optical performance of the photolithography device is poor.
3. By integrating the relevant status information of the photolithography device into the display interface of the machine display, no additional display may be added, which is helpful to ensure a simple overall mechanical structure of the photolithography device.

4. Through the position correction module in the photolithography device, the position of the light source may be corrected during the maintenance process of the light source, which is helpful to improve the degree of automation of operation and maintenance and save both time and labor.

Note that the above descriptions are only preferred embodiments of the present application and the technical principles applied. It may be understood by those skilled in the art that the present application is not limited to the specific embodiments described herein, and various apparent changes, adjustments and substitutions can be made without departing from the protection scope of the present application. Therefore, although the present application has been described in detail with the above embodiments, the present application is not limited to those embodiments and may comprise more other equivalent embodiments without departing from the concept of the present application. The scope of the present application is defined the appended claims.

What is claimed is:

1. A photolithography device, comprising a light source, wherein the photolithography device further comprises:
    a fixed slot, configured to install and fix the light source;
    a sensing module, configured to sense a distance information between the light source and the fixed slot;
    a prompt module, configured to send prompt information according to the distance information; and
    a determination module, configured to determine an installation status of the light source according to the prompt information;
    wherein the prompt module has a built-in threshold range of a distance between the light source and the fixed slot, and the prompt module compares the distance information with the threshold range in real time and sends prompt information based on a comparison result;
    wherein the prompt module comprises a light source position display configured to graphically display the threshold range and the distance information; and
    wherein
    the light source position display comprises a first display area and a second display area,
    the threshold range is displayed in the first displays area, the distance information is displayed in the second display area, the first display area overlaps with the second display area, and
    the visual statuses of the first display area and second display area are the same or different.

2. The photolithography device according to claim 1, wherein a through hole is formed on one side of the fixed slot, from which the light source is exposed; and the sensing module is arranged opposite to the through hole, and the sensing module senses the distance information between the light source and the fixed slot through the through hole.

3. The photolithography device according to claim 1, wherein the prompt information comprises the distance information between the light source and the fixed slot and information about whether the light source is installed in place.

4. The photolithography device according to claim 1, wherein the threshold range is a reference position range of the light source, and the light source is installed in place when the distance between the light source and the fixed slot is within the threshold range.

5. The photolithography device according to claim 1, wherein one side of the first display area overlaps with one side of the second display area.

6. The photolithography device according to claim 1, wherein the sensing module comprises a photoelectric sensor.

7. The photolithography device according to claim 6, wherein the photoelectric sensor comprises a receiving photoelectric sensor or a reflecting photoelectric sensor.

8. The photolithography device according to claim 6, wherein the photoelectric sensor is disposed on a side of the bottom of the fixed slot away from the light source.

9. The photolithography device according to claim 1, further comprising: a critical sensing module, located at a critical position in the fixed slot where the light source is installed in place, and configured to detect whether the light source is installed in place.

10. The photolithography device according to claim 9, wherein the prompt module further comprises a sound-light alarm; and
    the sound-light alarm is configured to give a sound-light warning when the critical sensing module detects that the light source is installed in place.

11. The photolithography device of claim 9, wherein the critical sensing module comprises a pressure sensor.

12. The photolithography device according to claim 11, wherein, when the light source comes into contact with the pressure sensor, the pressure sensor is configured to transmit information indicating that the light source is installed in place to the prompt module.

13. The photolithography device according to claim 1, further comprising: a position correction module that is communicatively connected to the determination module; and
    the position correction module is configured to correct a position of the light source when the determination module determines that the installation status of the light source is abnormal.

14. The photolithography device according to claim 13, wherein the position correction module is configured to correct the position of the light source during fine installation adjustment or during maintenance of the light source.

15. The photolithography device according to claim 13, wherein the position correction module comprises an annular electromagnetic chuck; and
    the annular electromagnetic chuck creates, when energized, an attractive force or a repulsive force to the light source so as to correct the installation status of the light source.

16. The photolithography device according to claim 15, wherein the annular electromagnetic chuck creates the attractive force to the light source when the distance between the light source and the fixed slot becomes larger; or, the annular electromagnetic chuck creates the repulsive force to the light source when the distance between the light source and the fixed slot becomes smaller.

17. A method for monitoring a position of a light source in a photolithography device, implemented with the photolithography device according to claim 1, comprising:
    sensing, with a sensing module, a distance information between the light source and the fixed slot;
    sending, with a prompt module, prompt information according to the distance information; and
    determining, with a determination module, an installation status of the light source according to the prompt information.

18. The method for monitoring the position of the light source according to claim 17, further comprising:

correcting, with a position correction module, the light source when the determination module determines that the installation status of the light source shows a deviation.

\* \* \* \* \*